United States Patent [19]
Strang et al.

[11] Patent Number: 5,813,868
[45] Date of Patent: Sep. 29, 1998

[54] ELECTRICAL CONTACT SPRING ARM POSITIONING ARRANGEMENT

[75] Inventors: Ward E. Strang, Fairfield; Carol Z. Howard, Oxford; Thomas M. McDonald, Monroe, all of Conn.

[73] Assignee: Hubbell Incorporated, Orange, Conn.

[21] Appl. No.: 788,137

[22] Filed: Jan. 24, 1997

[51] Int. Cl.⁶ ........................................... H01R 9/09
[52] U.S. Cl. .............................................. 439/82; 439/947
[58] Field of Search ........................... 439/78, 81, 82, 439/733.1, 83, 84

[56] References Cited

U.S. PATENT DOCUMENTS

| | | | |
|---|---|---|---|
| 4,332,430 | 6/1982 | Clark | 439/83 |
| 4,357,510 | 11/1982 | Fortuna | 200/283 |
| 5,064,379 | 11/1991 | Ryll et al. | 439/84 |
| 5,186,634 | 2/1993 | Thompson | 439/82 |
| 5,618,187 | 4/1997 | Goto | 439/79 |

OTHER PUBLICATIONS

Research Disclosure, No. 334, Kenneth Mason Publications Ltd, England, Feb. 1992.

*Primary Examiner*—Neil Abrams
*Assistant Examiner*—Barry M. L. Standig
*Attorney, Agent, or Firm*—Jerry M. Presson; Leopold Presser

[57] ABSTRACT

An arrangement for accurately positioning a spring arm of a contact element on a mating component, such as a printed circuit board. More particularly, disclosed is an electrical contact spring arm which incorporates structure for accurately positioning the electrical contact element spring arm structure in slots formed in a printed circuit board or suitable support in a rapid and highly accurately positioned automatic manner.

9 Claims, 2 Drawing Sheets

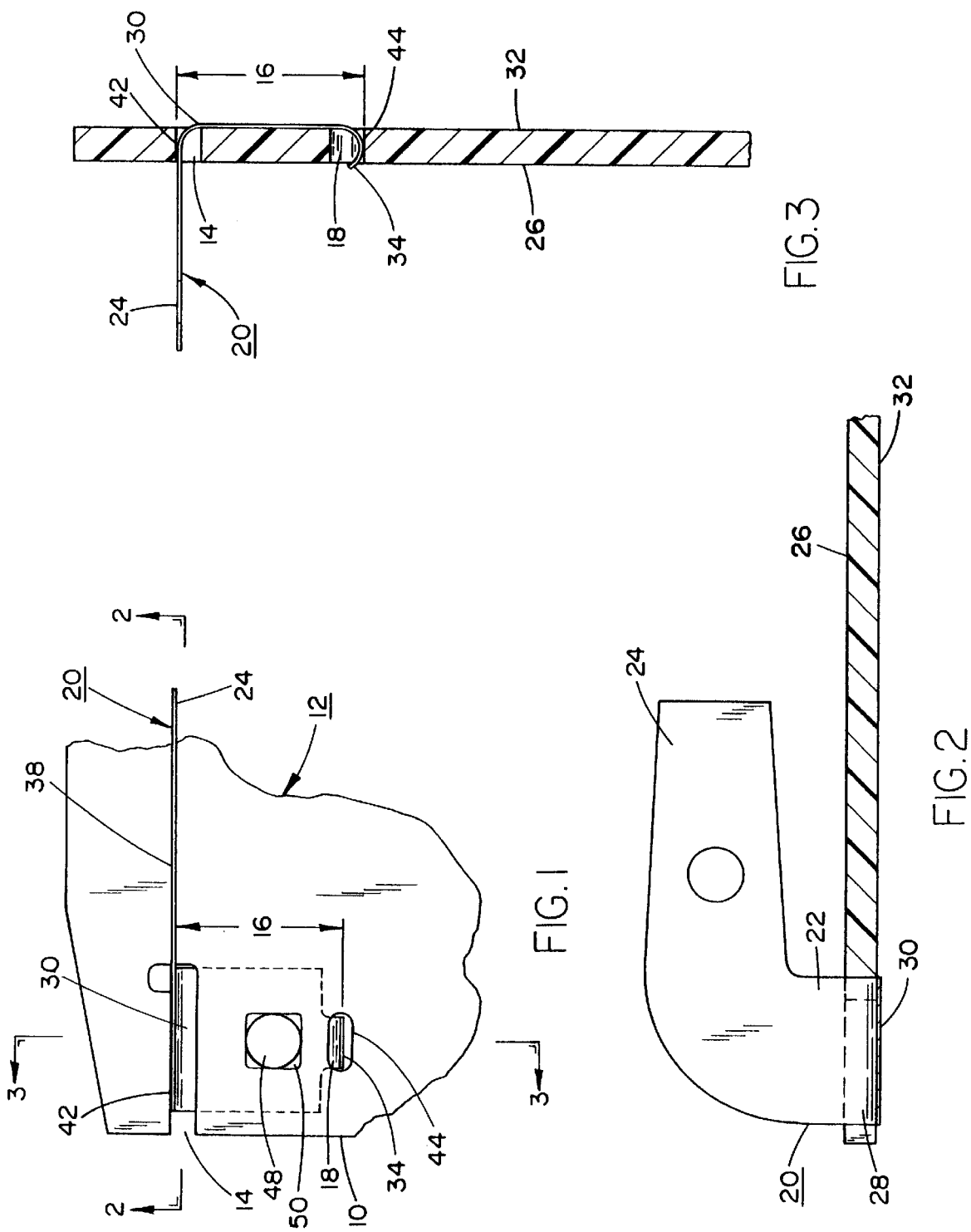

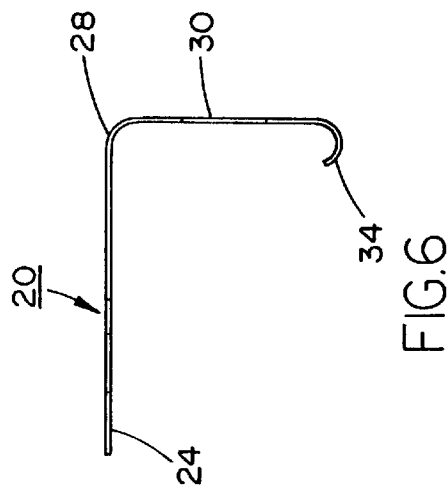
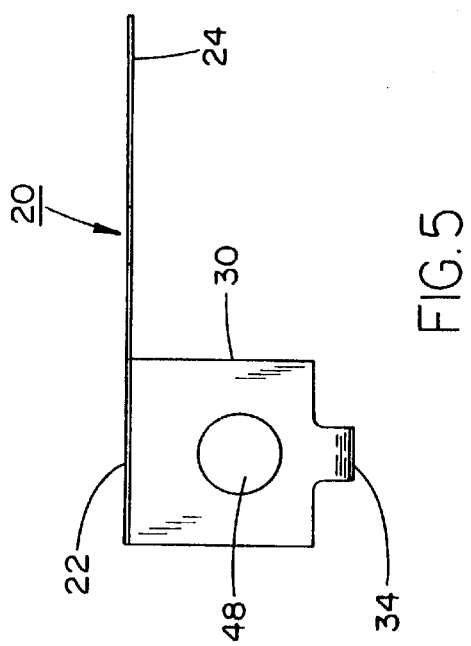
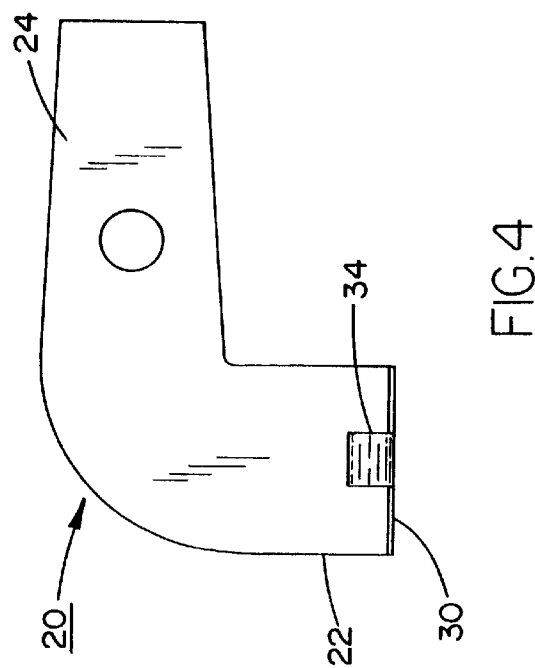

ELECTRICAL CONTACT SPRING ARM POSITIONING ARRANGEMENT

BACKGROUND OF THE INVENTION

1. Field of the Invention

The present invention relates to an arrangement for accurately positioning a spring arm of a contact element on a mating component, such as a printed circuit board. More particularly, the invention is directed to the provision of an electrical contact spring arm which incorporates structure for accurately positioning the electrical contact element spring arm structure in slots formed in a printed circuit board or suitable support in a rapid and highly accurately positioned automatic manner.

The accurate positioning of various electrical contact elements or switch devices on a substrate, such as a printed circuit board, and particularly edge mounted spring arm contact elements of relays or other similar types of electrical elements, is of extreme importance in order to be able to attain the necessary operating efficacy of the different devices.

In particular, unitarily constructed electrical spring arm contact elements are intended and designed to be inexpensively produced, especially through mass-production techniques, and are located in many instances in edge-mounted arrangements on mating components or supportive substrates; for example such as motherboards or printed circuit boards. Heretofore, such electrical contact elements consisted of complex or multi-component elements ordinarily incorporating spring contact arms and attaching structure for mounting the latter on a mating support, for example, such as a printed circuit board or the like, and resultingly necessitating implementing extensive manufacturing steps in producing the parts, and requiring skilled labor in mounting the electrical contact elements or switch devices on a printed circuit board, or the support structure on which they are to be accurately located.

2. Discussion of the Prior Art

Yamada et al., U.S. Pat. No. 5,259,793 discloses an edge connector for a printed circuit board in which a pair of metallic prongs of a contact element are intended to be pushed into locking engagement within applicable apertures formed in a substrate, and with a resilient spring contact element arm being integrally formed with the structure of the metallic prongs. In this instance, the complexity of the structure in having to drill the spaced apertures so as to accurately position the prongs contact spring element within an acceptable degree of accuracy necessitates a considerable amount of manual labor to be expended by skilled personnel in the installation of the electrical contact element prongs possessing the spring contact arm.

Fortuna, U.S. Pat. No. 4,357,510 discloses a switch device for use on a printed circuit board, wherein apertures must be formed in the circuit board to receive a positioning pin structure, and a further clip bracket is engaged in edge slots and having ends which are bent beneath the slots so as to engage the printed circuit board. This type of structure, in addition to being extremely complex, requires intense labor for accurately mounting the device on a printed circuit board, and also fails to provide the necessary accuracy in positioning a spring contact element as part of the switch device on the printed circuit board. Consequently, both as to construction and assembly, this particular switch device and the installation on a printed circuit board are expensive to manufacture and difficult to install in an economical manner.

Cobaugh et al., U.S. Pat. No. 4,362,353 discloses a contact clip for connecting a ceramic substrate to a printed circuit board, in which a spring latching element is adapted to be inserted through suitable apertures formed in the printed circuit board and lock the contact clip into position. This requires the provision of a complex structure in positioning the latching elements, and does not always warrant attaining the required degree of precision in assembling the various resilient spring components on a printed circuit board. Moreover, the construction of the resilient contact clip and its mounting structure is extremely complicated in nature, entailing extensive manufacturing costs and considerable labor in forming and installing the multi-part components thereof.

SUMMARY OF THE INVENTION

Accordingly, in order to provide an improved and simplified structure in comparison with the current state-of-the-art concerning the mounting of an electrical spring arm contact element for a relay, switch or other electrical device on a mating component; for example, such as a motherboard or a printed circuit board, and wherein the spring contact element is in a so-called "edge-mounted" position on the board, there is disclosed a spring arm contact element having an upstanding resilient planar contact arm configuration which, at a lower end thereof, extends into a plate-shaped flange element bent at an angle relative thereto, preferably but not necessarily at a right angle thereto. The opposite or distal end of the flange includes an upwardly bent tab portion, in essence having in cross-section a convexly curved C-shaped configuration. The upstanding spring arm is positionable to have the upstanding spring arm located in a first elongated slot formed in the mating part, such as the printed circuit board, with the slot extending inwardly from the edge of the board, such that the flange element is in flat surface-contacting engagement with the opposite or lower surface of the circuit board. The C-shaped tab portion on the flange member which is distant from the upstanding spring arm planar element extends into a second aperture or slot formed in the printed circuit board at a spacing and in parallel with the edge slot. The length of the flange portion between the upstanding planar spring contact arm, and the upwardly C-shaped tab portion at the opposite end thereof is dimensioned so as to cause the spring arm and the tab portion to be resiliently biased against the spaced apart or distal edges of, respectively, the edge slot and second slot in the printed circuit board, thus providing a biasing or compressive force inasmuch as the overall dimension between the planar arm portion and the tab portion of the electrical spring arm contact element is slightly greater than the distance between the distal or far edges of the two positioning slots, thereby creating an interference fit with the spring arm contact element and affording an automatic accurate alignment in effectuating the positioning of the spring arm contact element on the printed circuit board.

Accordingly, it is an object of the present invention to provide an accurate positioning arrangement for an electrical spring arm contact element of a relay or other electrical device on a mating part on which it is to be mounted, such as a printed circuit board.

More particularly, pursuant to a more specific object of the present invention, there is contemplated the provision of a spring arm contact element as described herein, wherein an interference fit is provided by the spring contact arm of the spring contact element and a tab portion on a flange-like plate extending bent at an angle from the spring arm and the distal or spaced apart edges of two spaced positioning slots which are formed in the printed circuit board and which receive, respectively, the spring arm and the tab portion of the contact element.

A still further object of the present invention is to provide a spring arm contact element for electrical devices or the like, in which a planar resilient spring arm extending upwardly from a printed circuit board has a lower end thereof inserted into a first positioning slot formed in the edge of the printed circuit board, and with an angularly bent flange portion of the spring arm extending below the board in surface contact therewith having an upwardly curved tab end extending into a second positioning slot in the printed circuit board so as to facilitate an interference fit between the spring arm and the board to provide for accurate alignment in positioning of the spring contact element when mounted on the printed circuit board.

BRIEF DESCRIPTION OF THE DRAWINGS

Reference may now be had to the following detailed description of preferred embodiments of the invention, taken in conjunction with the accompanying drawings; in which:

FIG. 1 illustrates a plan view of a fragmentary portion of a printed circuit board having the electrical spring arm contact element pursuant to the invention mounted thereon;

FIG. 2 illustrates an elevational view of the printed circuit board and electrical spring arm contact element shown in an elevational sectional view taken along line 2—2 in FIG. 1;

FIG. 3 illustrates an end sectional view taken along line 3—3 in FIG. 1;

FIG. 4 illustrates an elevational side view of the spring arm contact element;

FIG. 5 illustrates a top plan view of the spring contact arm element; and

FIG. 6 illustrates an end view of the spring contact arm element.

DETAILED DESCRIPTION OF PREFERRED EMBODIMENTS

Referring now in particular to the drawings, as illustrated in FIGS. 1 through 3 of the drawings, there is shown an edge portion 10 of a printed circuit board 12 having a first elongated linear slot 14 provided therein. At a predetermined spacing 16 therefrom, a short elongated slot or aperture 18 is formed in the board so as to be in a predetermined parallel spaced relationship with slot 14, with the second slot 18 being located inwardly of the edge 10 of the printed circuit board 12 into which the first slot 14 is cut.

Positioned in the first slot 14 which is cut into the printed circuit board 12 is an upstanding planar or flat spring arm contact element 20 for a relay or other electrical device (not shown), which projects in a vertically upstanding portion 22 and then horizontally curving portion 24 elbow-shaped above the upper surface 26 of the printed circuit board 12. The upstanding arm portion 22 extends through and in parallel with the first slot 14 in the printed circuit board 12.

A lower end or foot portion 28 of the flat spring contact arm 20 is bent at an angle relative thereto, which may be a right angle but is not limited thereto, and forms a flat plate or flange element 30 which extends for a distance which is essentially coextensive with the spacing 16 between the two slots 14, 18 in the printed circuit board 12, and is adapted to be in surface contact with the lower surface 32 of the circuit board 12. At the edge of the flange element 30 which is distant from the upstanding spring arm portion 22, there is formed a tab 34 which is bent upwardly into a generally C-shaped configuration in cross-section, but the length of which extends in parallel with the plane of spring arm portion 22. Thereby, the tab 34 is adapted to engage into the second shorter slot 18 which is formed in the printed circuit board 12.

The length of the flange element 30 of the spring arm member 20, in effect, the total overall dimension between the rear surface 38 of the upstanding spring contact arm portion 22 and the outermost dimension of the upwardly and convexly bent tab 34 on the flange element 30 is calibrated to be slightly greater than the distance between the distant or spaced apart wall surfaces 42 and 44 of, respectively, the first and second slots 14, 18, such that upon the spring contact arm element 20 being inserted into the printed circuit board 12 whereby the flat plate or arm portion 22 extends upwardly through the first slot 14, and the C-shaped tab 34 is engaged in the second slot 18, there is a biasing force exerted through the interference fit of the spring contact components within the two slots 14, 18, in which these components are forced against the respective slot wall surfaces 42, 44, thereby ensuring that the spring arm contact element 20 is in a properly aligned position relative to the printed circuit board.

A suitable aperture 48 is formed in the plate portion or flange element 30 in alignment with an aperture or hole 50 extending through the printed circuit board 12, so as to enable the insertion therethrough of a suitable fastener element (not shown) for fastening the spring arm contact element 20 to the printed circuit board 12.

Preferably, although not necessarily, the material of the resilient spring arm contact element 20 is constituted of a beryllium copper or a phosphor bronze alloy, although other electrically conductive materials or metals may be suitably employed in conjunction with the present invention.

Furthermore, although the flange element 30 of the spring contact arm 20 has been illustrated as being bent extending in one direction relative to arm portion 22, it is of course possible that the flange element and its tab 34 at the opposite end thereof, can be bent so as to extend in the opposite direction relative to the plane of the spring arm portions 20, 22, and whereby the slots 14, 18 which are formed in the printed circuit board 12 extend oriented in an opposite or inverted relationship relative to each other.

In summation, in order to be able to expeditiously and accurately position the spring contact arm element 20 of the relay or other electrical equipment in the mating or supportive part, such as the printed circuit board 12, having the edge slot 14 and spaced second slot 18 formed therein with an interference fit between the spring contact arm 20 bearing against surface 42 of slot 14 and the distant slot surface 44 of slot 18 coupled by the upwardly curving tab 34 on the flange element 30, this being effected by pushing the arm portion or the flat plate 20 of the spring contact arm element up through the first slot 14 in the edge 10 of the printed circuit board 12. Thereafter, or concurrently therewith, the flange element 30 of the spring arm contact is positioned in surface contact with the opposite surface or lower side 32 of the printed circuit board 12. The tab 34 at the other end of the flange element 30 is pushed upwardly into the second slot 18 in the printed circuit board and is biased against the opposite wall surface 44 of the second slot 18 which is distant from the first slot 14 so as to force the spring contact arm plate against the far wall surface 42 of the first slot 14. Thus, inasmuch as the dimension or length between the back surface of arm portion 20 and the outer end of tab 34 of the spring contact arm is always greater than the distance between the far or opposite sides 42, 44 of the two positioning slots 14, 18 in the printed circuit board, there is always present an interference fit, and resultingly alignment is attained in a quick and rapid manner without the need for providing fixtures or any special tooling, or skilled labor in order to properly position the spring contact arm element on the printed circuit board.

While there has been shown and described what are considered to be preferred embodiments of the invention, it will, of course, be understood that various modifications and changes in form or detail could readily be made without departing from the spirit of the invention. It is, therefore, intended that the invention be not limited to the exact form and detail herein shown and described, nor to anything less than the whole of the invention herein disclosed as hereinafter claimed.

What is claimed is:

1. An electrical contact spring arm structure adapted to be mounted on a circuit board having first and second slots extending therethrough at predetermined spacings relative to each other, said spring arm structure comprising:

(a) a planar element having a first upstanding flat element adapted to extend upwardly through said first slot to form a spring arm;

(b) a flange element at a lower end of said first flat element extending below said circuit board at an angle relative to the plane of said first upstanding flat element, and an upwardly curving tab member on an edge of said flange element opposite said first portion in parallel spaced relationship therewith extending into said second slot.

2. A spring arm structure as claimed in claim 1, wherein said tab member is convexly curved in transverse cross-section.

3. A spring arm structure as claimed in claim 1, wherein an upper end of the first upstanding flat element of said planar plate element extends into a second flat element bent within the plane of said first upstanding flat element so as to define an elbow-shaped spring arm contact arm configuration.

4. A spring arm structure as claimed in claim 1, wherein said structure is constituted of a resiliently flexible metallic material.

5. A spring arm structure as claimed in claim 4, wherein said metallic material is selected from the group of materials consisting of beryllium copper and phosphor bronze alloy.

6. A spring arm structure as claimed in claim 1, wherein said flange element is positioned in surface contact with a lower surface of said circuit board.

7. A spring arm structure as claimed in claim 6, wherein said first upstanding flat element and said tab member are dimensioned spaced relative to each other so as to be in an interference fit upon being respectively positioned in said first and second slots.

8. A spring arm structure as claimed in claim 7, wherein said first slot is a linear slot cut into an edge of said circuit board, and said second slot is an elongate aperture extending in parallel spaced relationship with said first slot.

9. A spring arm structure as claimed in claim 6, wherein an aperture is formed in said flange element adapted to be in alignment with an aperture in said circuit board for the passage therethrough of a fastener for fastening said structure to said circuit board.

* * * * *